Aug. 22, 1972 R. GERETH ETAL 3,686,036
SOLAR CELL WITH METAL LAYERED CONTACT AND METHOD OF MANUFACTURE
Filed Oct. 29, 1969
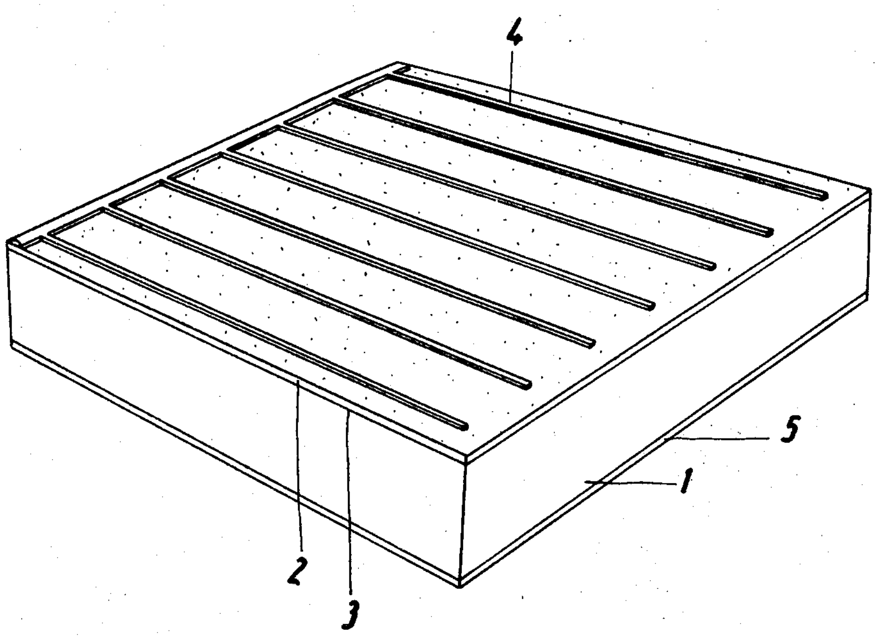
*Inventors.*
Reinhard Gereth
Horst Fischer
BY Spencer & Kaye
ATTORNEYS United States Patent Office 3,686,036
Patented Aug. 22, 1972

3,686,036

SOLAR CELL WITH METAL LAYERED CONTACT AND METHOD OF MANUFACTURE

Reinhard Gereth and Horst Fischer, Heilbronn, Germany, assignors to Telefunken Patentverwertungsgesellschaft m.b.H., Ulm, Donau, Germany
Filed Oct. 29, 1969, Ser. No. 872,237
Claims priority, application Germany, Nov. 4, 1968, P 18 06 835.4
Int. Cl. H01l *15/02*
U.S. Cl. 136—89 9 Claims

ABSTRACT OF THE DISCLOSURE

A solar cell comprises a semiconductor body having one or both contacts of three layers, namely, a first component of silver, a second layer of titanium chromium, molybdenum or tantalum and a third layer of precious metal which may be either contained in the second layer or may form a layer between the second and first layers. A method of contacting a solar cell by vapour deposition of the layers is also included.

BACKGROUND OF THE INVENTION

The invention relates to a solar cell having a contact which contains silver as a first layer.

SUMMARY OF THE INVENTION

According to the invention, there is provided a solar cell including a semiconductor body and a contact comprising a first layer of silver, a second layer selected from the group consisting of titanium, chromium, molybdenum and tantalum and a third layer of a precious metal.

BRIEF DESCRIPTION OF THE DRAWING

The invention will now be described in greater detail, by way of example with reference to the accompanying drawing, the single figure of which is a perspective view of a solar cell in accordance with the invention.

DESCRIPTION OF THE PREFERRED EMBODIMENT

Basically a solar cell with a contact which contains silver as a first layer has titanium, chromium, molybdenum or tantalum as a second layer and a precious metal as the third layer. The precious metal is contained in the second layer or is disposed in the form of an intermediate layer between the second layer and the silver. If the precious metal is contained in the second layer, the precious metal is admixed with the second layer or alloyed therewith.

This contact is very resistant to temperature and corrosion and, in addition, can be subjected to temperature cycles with considerable fluctuations in temperature. The resistance to high temperatures and large fluctuations in temperature is particularly important because, as is known, solar cells are used to a large extent in space flight where they are subjected either directly to the radiation of the sun or shadow from the sun. Whereas temperatures in the region of 300° C. must be expected under the direct action of the sun, negative temperatures down to 200° C. occur in the shade from the sun. Experiments have shown that the solar cell according to the invention is equal to these extreme fluctuations in temperature. On the other hand, the action of high temperatures on the solar cell is actually positive because any radiation damage which the solar cell may suffer through radiation action in space is cured by heating the solar cell.

A further advantage of this contact consists in that wires can very easily be provided on the contact, by bonding, so that the connection of very many solar cells to form a solar battery as necessary in space flight, does not involve any particular difficulties.

The invention may be used both for the front and for the rear contact of the solar cell, that is to say the contact provided according to the invention is suitable both for the making of non-blocking contact to n-type semiconductor material and also to p-type semiconductor material. The invention is preferably used for semiconductor bodies of silicon.

Referring now to the drawing, there is shown the construction of a so-called n-type on p-type solar cell which consists of a semiconductor body 1 of silicon of p-type conductivity in one surface of which an n-type region 2 is indiffused. The p-type doping of the silicon substrate is obtained, for example, by the introduction of boron, while the n-type region 2 may be produced, for example, by the indiffusion of phosphorus. The n-type region 2 may have a thickness of $0.3\mu$ for example. Between the n-type region 2 and the portion of the semiconductor substrate excluded from the diffusion there is formed the p-n junction 3 necessary for the solar cell. The dimensions of the silicon body 1 may amount, for example, to 2 cm. x 2 cm. x 0.03 cm. The invention may likewise be used for so-called p-type on n-type solar cells wherein the p-type region is produced by diffusion instead of the n-type region.

As the drawing further shows, contact is made to the two semiconductor regions 1 and 2 forming the p-n junction by means of electrodes. Thus one electrode is provided at the front and one at the back of the solar cell, and the electrode which is at the front, which makes contact to the n-type region 2 is termed the front contact 4, while the electrode at the back of the semiconductor body, which is provided on the semiconductor substrate and hence on the p-type region 1 is termed back contact 5. Both the front contact 4 and the back contact 5 consist of the same material, namely, according to the invention, of a first layer of silver, a second layer of titanium, chromium, molybdenum or tantalum, and a third layer of a precious metal, preferably in the platinum group such as palladium and platinum.

The front contact 4 is constructed in the form of a grid or comb, while the back contact 5 represents a large-area electrode which, in contrast to the front contact, covers the entire back of the semiconductor body.

In order to produce the front and back contacts, according to the invention a layer of titanium for example is first vapour deposited, then a layer of precious metal, for example of palladium, and finally a layer of silver on the layer of palladium. The silicon body may be maintained at a temperature of about 150° C. during the vapour deposition which is preferably effected under vacuum. The thickness of the vapour-deposited titanium layer may amount to 350 A., the thickness of the palladium layer may amount to 50 to 200 A., and the thickness of the silver layer may amount to 5 $\mu$m. for example.

Experiments have shown that the solar-cell contacts proposed according to the invention have a very satisfactory bond strength even under extreme conditions and that, apart from resistance to corrosion and temperature stability, they have a low contact resistance as well as excellent ohmic behavious with respect to n-type and p-type material.

It will be understood that the above description of the present invention is susceptible to various modifications, changes and adaptations.

What we claim as new and desire to secure by Letters Patent of the United States is:

1. A solar cell including a semiconductor body and a contact to said body, said contact comprising a first layer of silver, a second component selected from the group consisting of titanium, chromium, molybdenum and tantalum, and a third layer of an element of the platinum group, said body and said layers being disposed one above the other in the sequence semiconductor body, second layer, third layer, first layer.

2. A solar cell as defined in claim 1, wherein said semiconductor body consists of silicon.

3. A solar cell as defined in claim 1, wherein said contact is provided both as a front contact and as a back contact.

4. A solar cell as defined in claim 1, said second layer being titanium.

5. A solar cell as defined in claim 4 said element of the platinum group being selected from the group consisting of platinum and palladium.

6. A solar cell as defined in claim 5, said element of the platinum group being platinum.

7. A solar cell as defined in claim 5, said element of the platinum group being palladium.

8. A solar cell including a semiconductor body and a contact to said body, said contact comprising a first layer of silver, a second layer selected from the group consisting of titanium, chromium, molybdenum and tantalum, said second layer containing an element of the platinum group, said body and said layers being disposed one above the other in the sequence: semiconductor body, second layer, and first layer.

9. A method of producing a contact for a solar cell comprising the steps of vapour depositing on a semiconductor body forming the cell, a layer selected from the group consisting of titaninum, chromium, molybdenum and tantalum, vapor depositing a layer of an element of the platinum group on said layer selected from said group, and vapour depositing a layer of silver on said layer of an element of the platinum group, the steps of vapour depositing being carried out in vacuum.

References Cited

UNITED STATES PATENTS

| | | | |
|---|---|---|---|
| 1,089,907 | 3/1914 | Collidge | 29—198 X |
| 1,228,194 | 5/1917 | Fahrenwald | 29—198 |
| 1,261,110 | 4/1918 | Fahrenwald | 29—198 UX |
| 2,375,154 | 5/1945 | Valterra | 29—198 |
| 3,106,489 | 10/1963 | Lepselter | 136—89 UX |
| 3,377,697 | 4/1968 | Hobbs | 117—217 X |
| 3,382,099 | 5/1968 | Montmory | 136—89 UX |
| 3,393,446 | 7/1968 | Hughes et al. | 117—217 X |
| 3,434,885 | 3/1969 | Mandelkorn et al. | 136—89 |
| 3,472,698 | 10/1969 | Mandelkorn | 136—89 |

ALLEN B. CURTIS, Primary Examiner

U.S. Cl. X.R.

29—198; 117—200, 217